(12) United States Patent
Kuo et al.

(10) Patent No.: US 10,553,648 B2
(45) Date of Patent: Feb. 4, 2020

(54) LIGHT-EMITTING DIODE DISPLAY DEVICE

(71) Applicant: Innolux Corporation, Miao-Li County (TW)

(72) Inventors: Shu-Ming Kuo, Miao-Li County (TW); Chih-Yung Hsieh, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 151 days.

(21) Appl. No.: 15/638,376

(22) Filed: Jun. 30, 2017

(65) Prior Publication Data

US 2018/0006091 A1 Jan. 4, 2018

(30) Foreign Application Priority Data

Jun. 30, 2016 (CN) .......................... 2016 1 0507568
Jun. 27, 2017 (CN) .......................... 2017 1 0498768

(51) Int. Cl.
| | |
|---|---|
| *H01L 27/15* | (2006.01) |
| *H01L 27/32* | (2006.01) |
| *H01L 51/52* | (2006.01) |
| *H01L 51/50* | (2006.01) |
| *H01L 51/00* | (2006.01) |

(52) U.S. Cl.
CPC ............ *H01L 27/32* (2013.01); *H01L 51/508* (2013.01); *H01L 51/5284* (2013.01); *H01L 51/0002* (2013.01); *H01L 51/5036* (2013.01)

(58) Field of Classification Search
CPC .................................................. H01L 27/156
See application file for complete search history.

(56) References Cited

U.S. PATENT DOCUMENTS

| | | | | |
|---|---|---|---|---|
| 2012/0113672 | A1* | 5/2012 | Dubrow | B82Y 20/00 362/602 |
| 2014/0353698 | A1* | 12/2014 | Chen | H01L 33/0079 257/94 |
| 2015/0333102 | A1* | 11/2015 | Sato | H01L 33/38 257/13 |
| 2016/0154170 | A1* | 6/2016 | Thompson | G02F 1/133603 362/609 |
| 2016/0211245 | A1* | 7/2016 | Do | H01L 25/0753 |
| 2016/0218142 | A1* | 7/2016 | Bang | H01L 21/768 |
| 2017/0146856 | A1* | 5/2017 | Yokota | G02F 1/133514 |

* cited by examiner

*Primary Examiner* — Peniel M Gumedzoe
*Assistant Examiner* — Christopher A Johnson
(74) *Attorney, Agent, or Firm* — JCIPRNET

(57) ABSTRACT

A light emitting diode (LED) display device including an array substrate, an opposite substrate, wall structures, at least one LED, an upper reflection layer, a first light barrier layer, a lower reflection layer and a light diffusion material layer. The array substrate, the wall structures and the opposite substrate define an accommodating region. The upper reflection layer is disposed on the LED, wherein the upper reflection layer at least partially covers an upper surface of the LED. The first light barrier layer is disposed on a side of the upper reflection layer away from the array substrate. An orthographic projection of the upper reflection layer on the array substrate is at least partially overlapped with an orthographic projection of the lower reflection layer on the array substrate. The light diffusion material layer is filled in the accommodating region.

20 Claims, 11 Drawing Sheets

LIGHT-EMITTING DIODE DISPLAY DEVICE

CROSS-REFERENCE TO RELATED APPLICATION

This application claims the priority benefits of Chinese application serial no. 201610507568.1, filed on Jun. 30, 2016, and Chinese application serial no. 201710498768.X, filed on Jun. 27, 2017. The entirety of each of the above-mentioned patent applications is hereby incorporated by reference herein and made a part of this specification.

BACKGROUND OF THE DISCLOSURE

Field of the Disclosure

The disclosure relates to a display device, and particularly relates to a light-emitting diode (LED) display device.

Description of Related Art

Since light-emitting diode (LED) display device has some advantages active luminescence, high brightness, or a service life is longer than a service life of an organic light-emitting diode (OLED), the LED display device becomes one of quickly developed techniques of novel displays in recent years. In detail, the LED display device mainly consists of a thin-film transistor array substrate and LEDs arranged in an array. The LED display device generally adopts a top emitting design. A wavelength conversion material layer is disposed on light-emitting surfaces of the LEDs to achieve an effect of adjusting light-emitting wavelengths. However, in order to achieve better wavelength conversion efficiency, a thickness of the current wavelength conversion material layer is at least greater than 20 µm. The thickness of the wavelength conversion material layer not only increases a thickness of the whole structure, but it also is greatly raised the difficulty of a process due to excessive stacking thickness of the whole structure.

SUMMARY OF THE DISCLOSURE

The disclosure is directed to a light-emitting diode (LED) display device, which has a thinner overall thickness.

The disclosure provides an LED display device including an array substrate, an opposite substrate, a plurality of wall structures, at least one LED, an upper reflection layer, a first light barrier layer, a lower reflection layer and a light diffusion material layer. The opposite substrate is disposed opposite to the array substrate. The wall structures are disposed between the array substrate and the opposite substrate. The array substrate, the wall structures and the opposite substrate define at least one accommodating region. The at least one LED is disposed on the array substrate, and is located in the at least one accommodating region. The upper reflection layer is disposed between the at least one LED and the opposite substrate. The orthographic projection of the upper reflection layer on the array substrate is at least partially overlapped with the orthographic projection of the at least one light-emitting diode. The first light barrier layer is disposed between the upper reflection layer and the opposite substrate. The lower reflection layer is disposed on the array substrate, and is located in the at least one accommodating region. An orthographic projection of the upper reflection layer on the array substrate is at least partially overlapped with an orthographic projection of the lower reflection layer on the array substrate. The light diffusion material layer is filled in the at least one accommodating region.

According to the above descriptions, since the light diffusion material layer of the LED display device of the disclosure is filled in the accommodating region defined by the wall structures, the array substrate and the opposite substrate, and the orthographic projection of the upper reflection layer on the array substrate is at least partially overlapped with the orthographic projection of the at least one light emitting diode, the LED can emit lights from a lateral direction. Compared to the conventional LED display device in which the wavelength conversion material layer is disposed on the light emitting surface of the LED, and the LED emits light from a forward direction, the LED display device of the disclosure is unnecessary to preserve the thickness of the wavelength conversion material layer, such that the whole structure thereof has a thinner thickness.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1A:
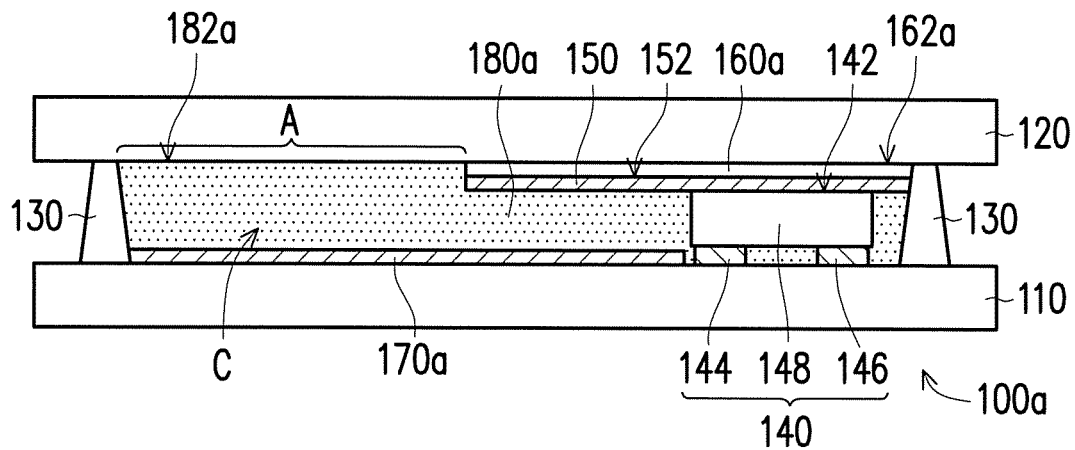
FIG. 1A is a partial cross-sectional view of a light-emitting diode (LED) display device according to an embodiment of the disclosure.
Figure 1B:
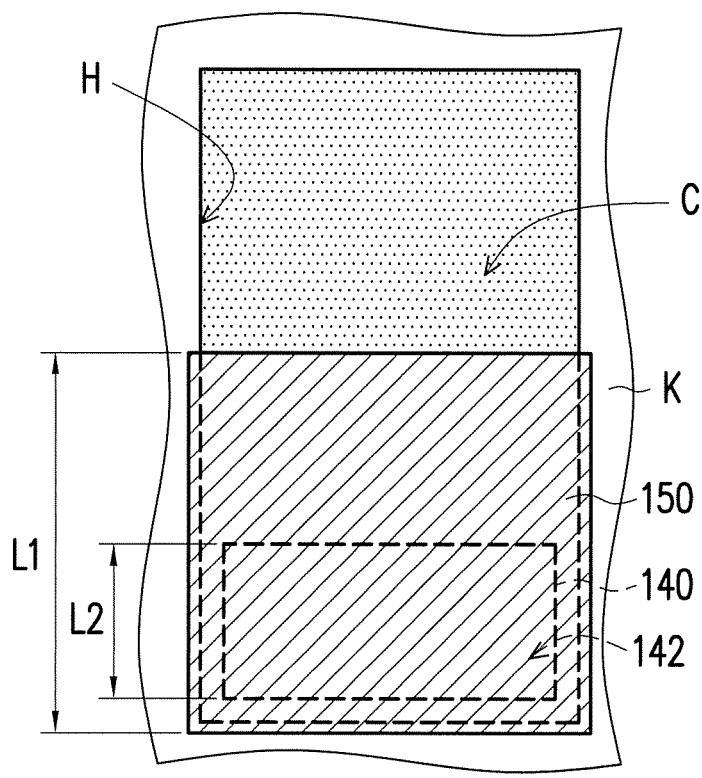
FIG. 1B is a partial top view of the LED display device of FIG. 1A.

Reference will now be made in detail to the present embodiments of the disclosure, examples of which are FIG. 1A is a partial cross-sectional view of a light-emitting diode (LED) display device according to an embodiment of the disclosure. FIG. 1B is a partial top view of the LED display device of FIG. 1A. To facilitate the description, some components are omitted in FIG. 1A and FIG. 1B. Referring to FIG. 1A, in the present embodiment, the LED display device 100a includes an array substrate 110, an opposite substrate 120, a plurality of wall structures 130, at least one LED 140, an upper reflection layer 150, a first light barrier layer 160a, a lower reflection layer 170a and a light diffusion material layer 180a. The opposite substrate 120 is disposed opposite to the array substrate 110. The array substrate 110 can be an active array substrate or a passive array substrate, or other suitable designs. The wall structures 130 are disposed between the array substrate 110 and the opposite substrate 120, wherein the array substrate 110, the wall structures 130 and the opposite substrate 120 define at least one accommodating region C. The at least one LED 140 is disposed on the array substrate 110, and is located in the accommodating region C. The upper reflection layer 150 is disposed between the LED 140 and the opposite substrate 120, wherein the orthographic projection of the upper reflection layer 150 on the array substrate 110 is at least partially overlapped with the orthographic projection of the LED 140 on the array substrate 110. In an embodiment, the upper reflection layer 150 can at least completely cover an upper surface 142 of the LED 140. The first light barrier layer 160a is disposed between the upper reflection layer 150 and the opposite substrate 120. The lower reflection layer 170a is disposed on the array substrate 110, and is located in the accommodating region C. An orthographic projection of the upper reflection layer 150 on the array substrate 110 is at least partially overlapped with an orthographic projection of the lower reflection layer 170a on the array substrate 110. The light diffusion material layer 180a is filled in the accommodating region C, wherein at least a part of the light diffusion material layer 180a is located between the upper reflection layer 150 and the lower reflection layer 170a, and at least another part of the light diffusion material layer 180a is not covered by the upper reflection layer 150, so as to expose a part of the opposite substrate 120 to define a first light-emitting region A.

In detail, the array substrate 110 is, for example, a thin-film transistor substrate, and the LED 140 is electrically connected to the array substrate through a flip-chip manner, or the LED 140 can be a vertical LED, or the LED is disposed on the array substrate 110 through an epitaxial manner, which is not limited by the disclosure. The opposite substrate 120 is, for example, a transparent cover plate, and a material of the opposite substrate 120 is, for example, glass or plastic, which is not limited by the disclosure. A width of the wall structures 130 is, for example, gradually decreased along a direction from the array substrate 110 toward the opposite substrate 120, though the disclosure is not limited thereto. It should be noted that the wall structures 130 of the present embodiment can be directly formed on the array substrate 110, or on the opposite substrate 120, or a part of the wall structures 130 is formed on the array substrate 110, and another part of the wall structures 130 is formed on the opposite substrate 120, which is not limited by the disclosure. Moreover, each of the accommodating regions C can be regarded as a sub-pixel region, wherein the sub-pixel region can also be defined by an opening H of a black matrix K in FIG. 1B, and the LED 140 is located close to a side of the accommodating region C, though the disclosure is not limited thereto.

In addition, as shown in FIG. 1A and FIG. 1B, the LED 140 of the present embodiment specifically includes a first electrode 144, a second electrode 146, and an epitaxial structure layer 148, wherein the first electrode 144 and the second electrode 146 are located on the same side of the epitaxial structure layer 148. In other words, the LED 140 of the present embodiment is specifically a horizontal LED, but is not limited thereto. In the present embodiment, the orthographic projection of the upper reflection layer 150 on the array substrate 110 is at least partially overlapped with the orthographic projection of the LED 140 on the array substrate 110, and the orthographic projection of the upper reflection layer 150 on the array substrate 110 may be extended beyond the orthographic projection of the LED 140 on the array substrate 110 In an embodiment, a length L1 of the upper reflection layer 150 is, for example, 1.1 to 5 times of a length L2 of the upper surface 142. In an embodiment, the upper surface 142 of the LED 140 may be directly covered, or the upper surface 142 of the LED 140 is not directly covered. It should be noted that a situation that the LED 140 has a rectangle contour is taken as an example for description, though the disclosure is not limited thereto. In other embodiments, the contour of the LED 140 can also be a square or other irregular shapes, which is still within a protection range of the disclosure. The contour of the first electrode 144 and the second electrode 146 is not particularly limited, wherein the contour of the orthographic projections of the first electrode 144 and the second electrode 146 on the array substrate 110 can be, for example, a square, rectangle, semicircle, or other irregular shapes, and the shapes can be solid, annular, or a combination thereof.

In this case, the material of the upper reflection layer 150 is, for example, a material with high reflectivity, which is, for example, Ag, Al, Cr, Ti, etc., though the disclosure is not limited thereto. The first light barrier layer 160a is, for example, a light absorbing layer, which directly covers the surface 152 of the upper reflection layer 150, and is located in the accommodating region C to effectively absorb external lights coming from the top of the opposite substrate 120. The lower reflection layer 170a is disposed on the array substrate 110, and the orthographic projection of the upper reflection layer 150 on the array substrate 110 is at least partially overlapped with the orthographic projection of the lower reflection layer 170a on the array substrate 110.

Moreover, the light diffusion material layer 180a of the present embodiment may be a scattering material layer, which covers the lower reflection layer 170a, wherein a first surface 162a of the light absorbing layer (i.e. the first light barrier layer 160a) is aligned with a second surface 182a of the light diffusion material layer 180a. the LED 140, the upper reflection layer 150, the light absorbing layer (i.e. the first light barrier layer 160a) and the lower reflection layer 170a are all in the accommodating region C, and the light diffusion material layer 180a is filled in the accommodating region C. Preferably, the light diffusion material layer 180a does not cover the upper surface 142 of the LED 140. In this case, a thickness of the light diffusion material layer 180a is slightly smaller than or equal to a height of the wall structures 130. Preferably, the thickness of the light diffusion material layer 180a is between 0.5 μm and 30 μm. Compared to the existing LED display device in which the wavelength conversion material layer is disposed above the light-emitting surface of the LED, the LED display device 100a of the present embodiment may have a thinner overall thickness.

In addition, by disposed the upper reflection layer 150 of the present embodiment on the upper surface 142 of the LED 140, not only a light-shielding effect is achieved to reduce the light produced by the LED 140 from emitting out of the LED display device 100a through a shorter path, a forward light of the LED 140 can also be reflected to emit through a lateral direction, and the light diffusion material layer 180a may effectively increase a length of an optical path of the light produced by the LED 140, and effectively improve a light mixing effect. Similarly, configuration of the lower reflection layer 170a may also increase the length of the optical path of the light produced by the LED 140 in the light diffusion material layer 180a, and improve the light mixing effect.

Moreover, in the present embodiment, since a part of the light diffusion material layer 180a is not covered by the upper reflection layer 150, the light is emitted out from the first light-emitting region A of the opposite substrate 120, and the LED display device 100a of the present embodiment can be regarded as a single side light-emitting display device.

In brief, the light diffusion material layer 180a of the LED display device 100a of the present embodiment is filled in the accommodating region C defined by the wall structures 130, the array substrate 110 and the opposite substrate 120, and the upper reflection layer 150 at least at least partially covers the upper surface 142 of the LED 140, and the LED 140 emits light from the lateral direction. Compared to the existing LED display device, the wavelength conversion material layer of the existing LED display device is disposed on the light-emitting surface of the LED, and the LED emits light from the forward direction, the LED display device 100a of the present embodiment is unnecessary to preserve the thickness of the wavelength conversion material layer on the top of the LED, and the thickness of the whole structure is thinner.

Figure 2A:
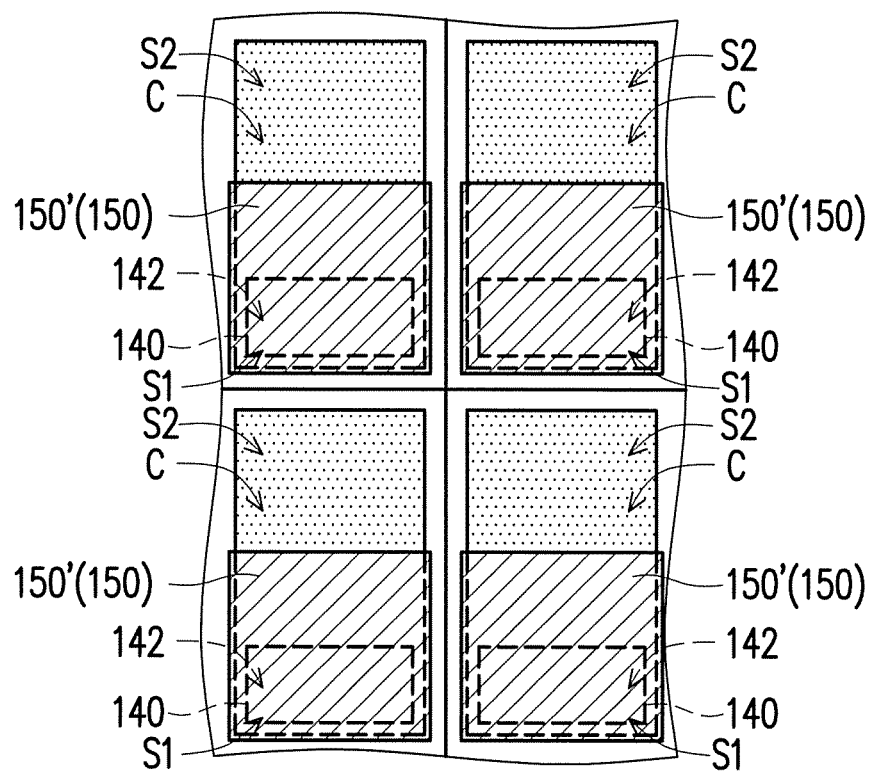
FIG. 2A to FIG. 2F are top views of a plurality of LEDs respectively located in a plurality of accommodating regions in the LED display devices according to a plurality of embodiments of the disclosure.
Figure 2B:
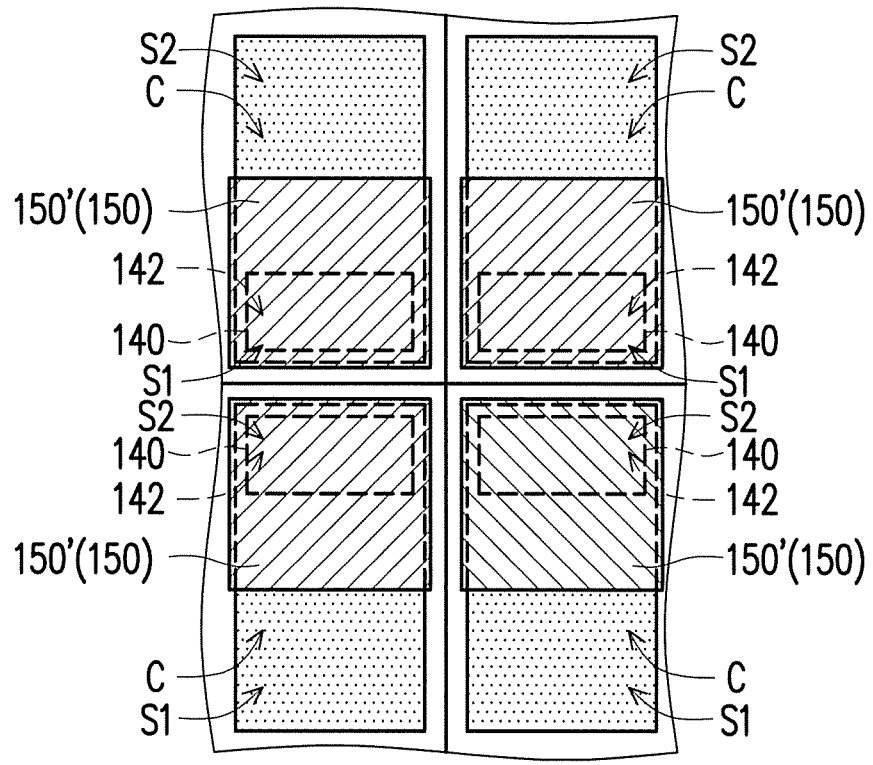
Figure 2C:
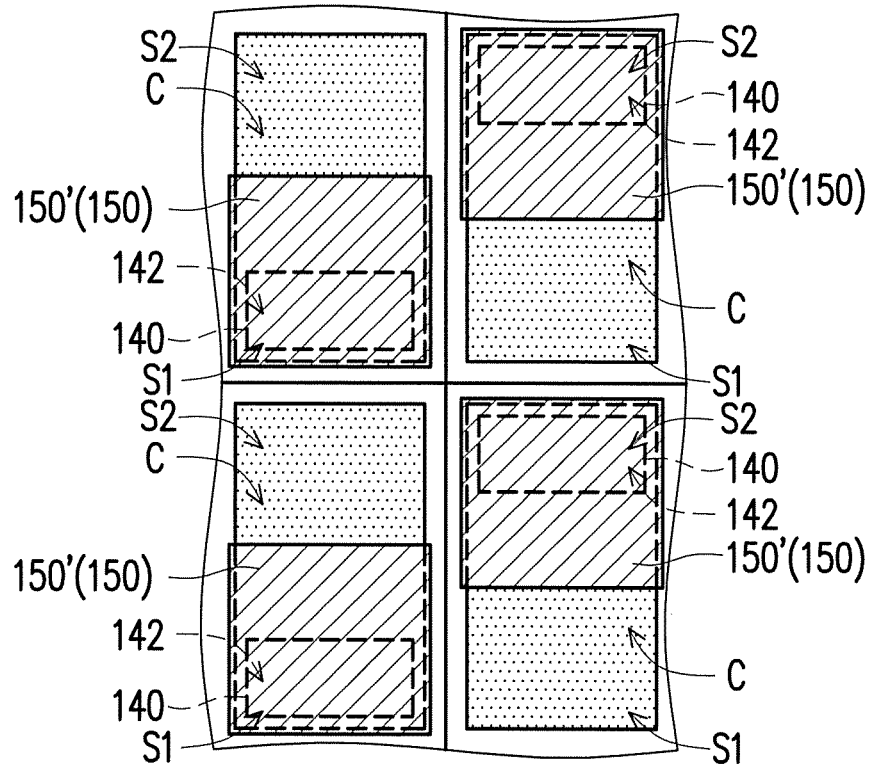
Figure 2D:
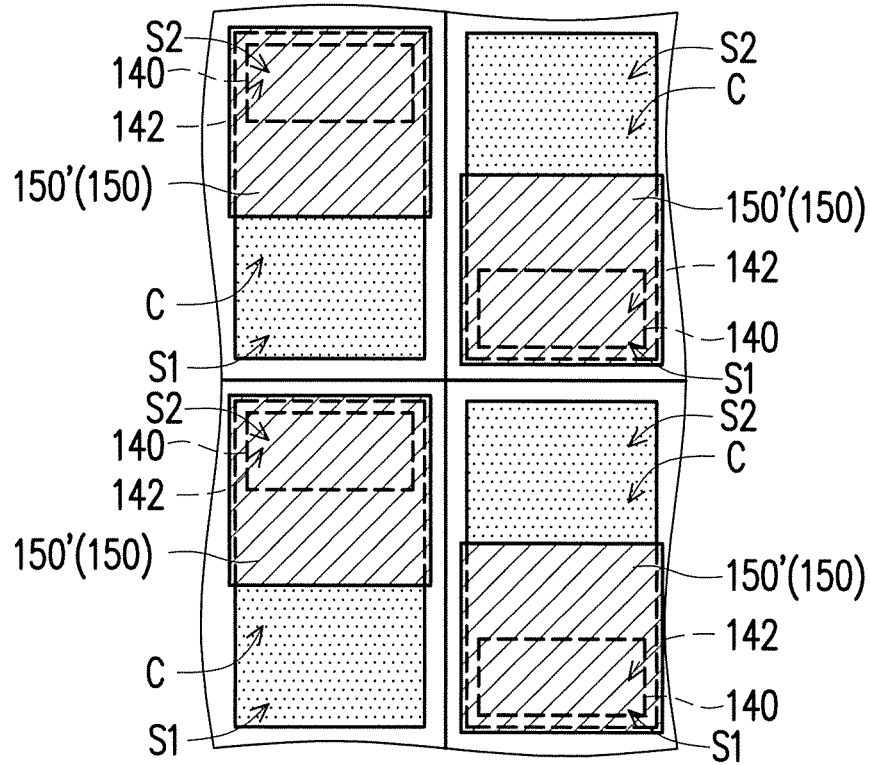
Figure 2E:
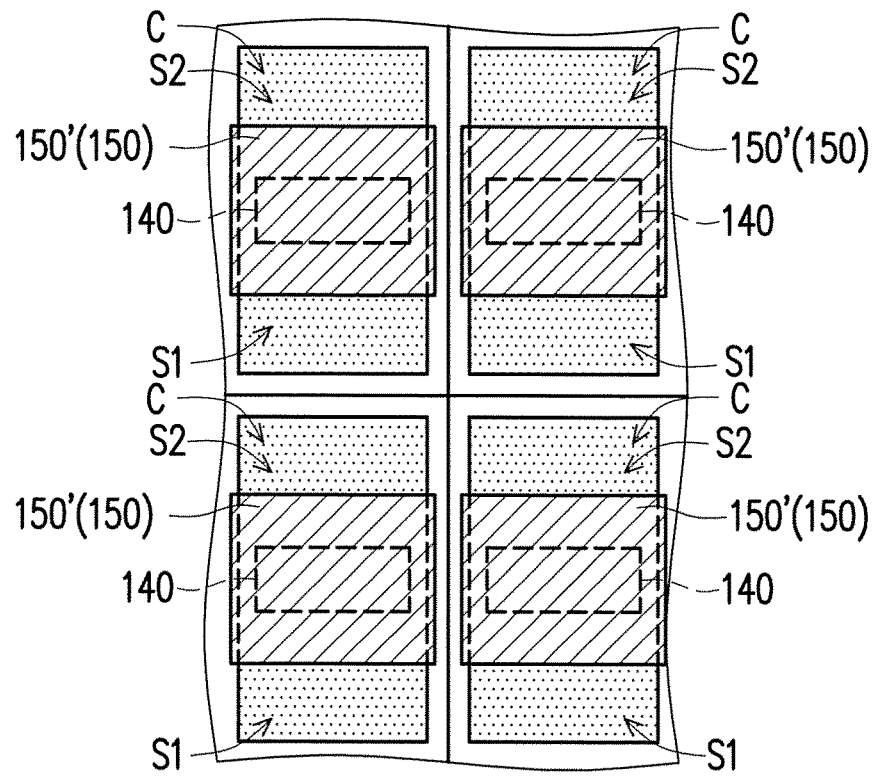

FIG. 2A to FIG. 2F are top views of a plurality of LEDs respectively located in a plurality of accommodating regions in the LED display devices according to a plurality of embodiments of the disclosure. For simplicity's sake, some components are omitted in FIG. 2A to FIG. 2D. Referring to FIG. 2A, in the present embodiment, the LEDs 140 in the LED display device 100b1 are respectively located in the accommodating regions C close to a first side S1 (for example, a lower side), and are arranged in parallel, wherein one side (for example, the side substantially perpendicular to a scan line) of each of the LEDs 140 is adjacent to another LED 140. The upper reflection layer 150 includes a plurality of upper reflection blocks 150', wherein the upper reflection blocks 150' at least partially cover the upper surfaces 142 of the LEDs 140 and extend beyond the upper surface 142. Certainly, in other embodiments, referring to FIG. 2B, a part of the LEDs 140 of the LED display device 100b2 is located in the accommodating regions C close to a first side S1 (for example, a lower side), and the other part of the LEDs 140 is located in the accommodating regions C close to a second side S2 (for example, an upper side) and are arranged in parallel, wherein the second side S2 is opposite to the first side S1, and the two sides of the LED 140 perpendicular to each other are respectively adjacent to another LED 140. Alternately, referring to FIG. 2C and FIG. 2D, in the LED display devices 100b3, 100b4, in the accommodating regions C arranged in parallel, the LEDs 140 disposed in the adjacent accommodating regions C are respectively located at different sides of the accommodating regions C to present an alternation arrangement. Alternately, referring to FIG. 2E, the LEDs 140 in the LED display device 100b5 are all located in the middle of the accommodating regions C, a distances between short sides of the accommodating region C are greater than 0 and smaller than a half of length of long sides of the accommodating region C, and two sides of the LED parallel to the short sides of the accommodating region C, two opposite sides of the LED 140 in each sub-pixel region may emit light.

Figure 2F:
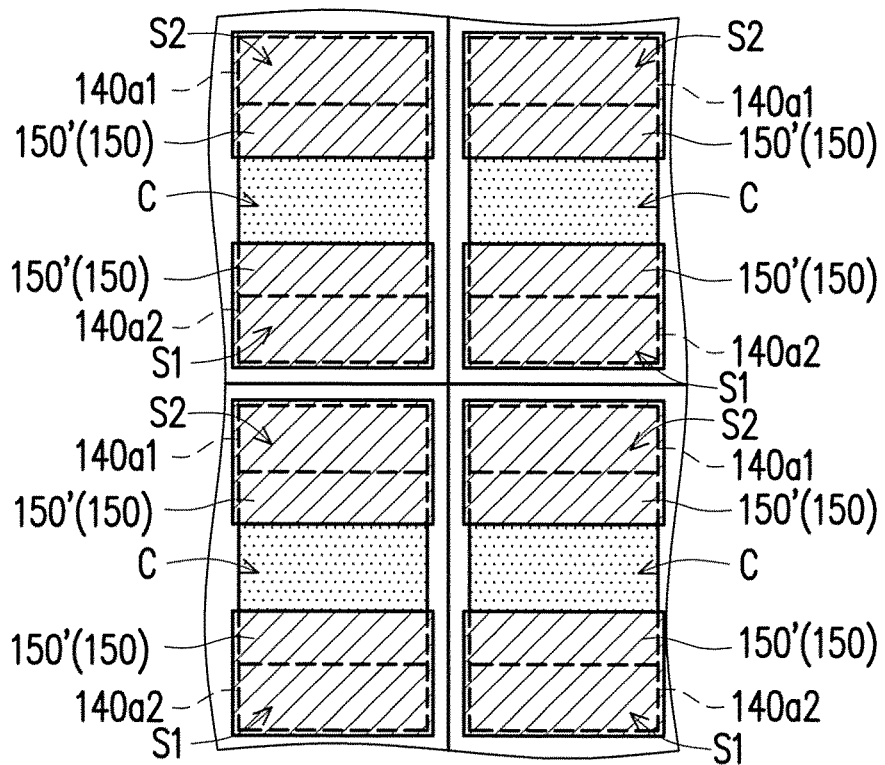

Alternatively, referring to FIG. 2F, at least two LEDs 140a1, 140a2 are disposed in each of the accommodating regions C of the LED display device 100b6 of the present embodiment, wherein the LEDs 140a1, 140a2 are respectively close to two opposite sides (for example, the first side S1 and the second side S2) of the accommodating region C, and main light-emitting wavelengths of the plurality of the LEDs 140a1, 140a2 are within a wavelength range of a specific color light, and a difference between the main light-emitting wavelengths of the plurality of the LEDs 140a1, 140a2 is smaller than or equal to 40 nm. For example, if the specific color light is red light, i.e. the LEDs 140a1, 140a2 are red light LEDs, and the main light-emitting wavelengths range between 610 nm and 650 nm, and if the specific color light is green light, i.e. the LEDs 140a1, 140a2 are green light LEDs, and the main light-emitting wavelengths range between 510 nm and 550 nm.

In FIG. 2F, by disposing the at least two LEDs 140a1, 140a2 with the main light-emitting wavelengths within the wavelength range of the specific color light in a same accommodating region C, besides that a situation that the sub-pixel region has no brightness due to failure of one LED 140a1 (or LED 140a2) is avoided, the specific color light with an average wavelength can be obtained through a light mixing manner. Further, in the embodiment of FIG. 2F, each of the accommodating regions C can be selectively configured with the LEDs 140a1, 140a2, and within the range of the specific color light, for example, the range of the main light-emitting wavelength is between 610 nm and 650 nm, a difference between any two color point coordinates in the accommodating region C can be smaller than 0.03. In other words, if each accommodating region C is regarded as a sub-pixel region, a difference of any two color point coordinates in the sub-pixel region with the range of the main light-emitting wavelength between 610 nm and 650 nm can be smaller than 0.03. Taking a sub-pixel region emitting a red light as an example, if one color point coordinate of the sub-pixel region by light emission is (x1,y1), and another color point coordinates of the sub-pixel region by light emission is (x2,y2), x2-x1 is then smaller than 0.03, and y2-y1 is smaller than 0.03. The sub-pixel region emitting a green light or the sub-pixel region emitting a blue light can be deduced by analogy, which is not repeated. In this way, an inventory problem is effectively reduced, or a display image of the LED display device is uniformity.

It should be noted that reference numbers of the components and a part of contents of the aforementioned embodiment are also used in the following embodiment, wherein the same reference numbers denote the same or like components, and descriptions of the same technical contents are omitted. The aforementioned embodiment can be referred for descriptions of the omitted parts, and detailed descriptions thereof are not repeated in the following embodiment.

Figure 3:
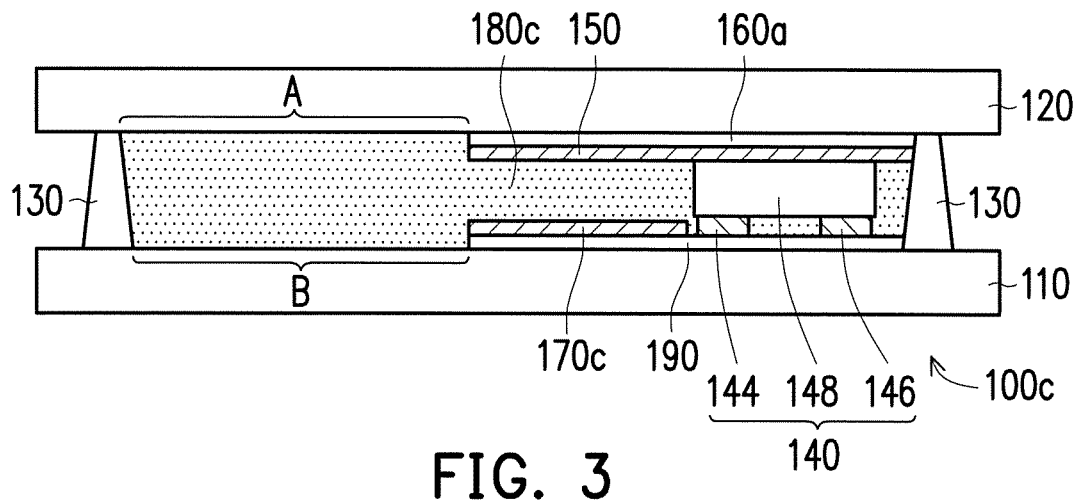
FIG. 3 is a partial cross-sectional view of an LED display device according to another embodiment of the disclosure.

FIG. 3 is a partial cross-sectional view of an LED display device according to another embodiment of the disclosure. Referring to FIG. 3, the LED display device 100c of the present embodiment is similar to the LED display device 100a of FIG. 1A, and a main difference between the LED display device 100a and the LED display device 100c is that the LED display device 100c of the present embodiment further includes a second light barrier layer 190, which is disposed between the array substrate 110 and the lower reflection layer 170c, and preferably extends to be located between the LED 140 and the array substrate 110, wherein the second light barrier layer 190 is, for example, a light absorbing layer, which is used for absorbing an external light coming from the underneath of the array substrate 110. Particularly, the orthographic projection of the lower reflection layer 170c on the array substrate 110 is completely overlapped with the orthographic projection of the upper reflection layer 150 on the array substrate 110. As shown in FIG. 3, the light diffusion material layer 180c exposes a part of the array substrate 110, i.e. a part of the light diffusion material layer 180c is not overlapped with the lower reflection layer 170c to define a second light-emitting region B. The light emitted by the LED 140 is emitted out from the first light-emitting region A and the second light-emitting region B through reflection of the upper reflection layer 150 and the lower reflection layer 170c. The LED display device 100c of the present embodiment can be regarded as a double side light-emitting display device.

Figure 4:
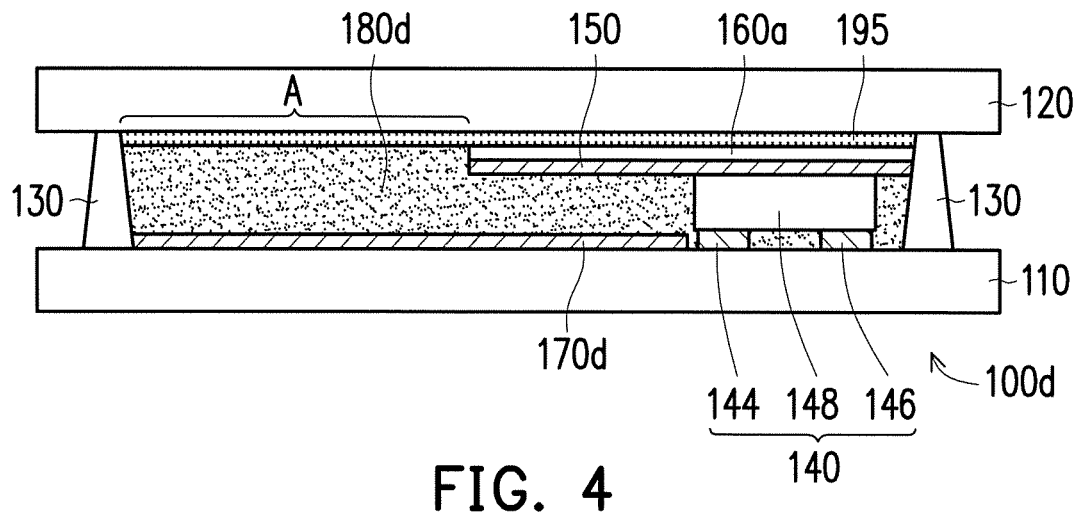
FIG. 4 is a partial cross-sectional view of an LED display device according to another embodiment of the disclosure.

FIG. 4 is a partial cross-sectional view of an LED display device according to another embodiment of the disclosure. Referring to FIG. 4, the LED display device 100d of the present embodiment is similar to the LED display device 100a of FIG. 1A, and a main difference there between is that the light diffusion material layer 180d of the LED display device 100d of the present embodiment is embodied by a quantum dot material layer, a phosphor material layer, or a combination thereof. Moreover, the LED display device 100d further includes at least one first color filter pattern 195, which is disposed on the opposite substrate 120, and located between the opposite substrate 120 and the light diffusion material layer 180d. The first color filter pattern 195 may further extend to be located between the opposite substrate 120 and the light absorbing layer 160a. The light emitted by the LED 140 is reflected by the upper reflection layer 150 and the lower reflection layer 170d, and the light is incident to the light diffusion material layer 180d in the lateral light-emitting manner, and the light diffusion material layer 180d increases a length of the optical path of the light emitted by the LED 140, and improves a light conversion effect. Then, the light after light mixing is further filtered by the first color filter pattern 195, and the light emitted from the first light-emitting region A has better light uniformity or color purity.

Figure 5:
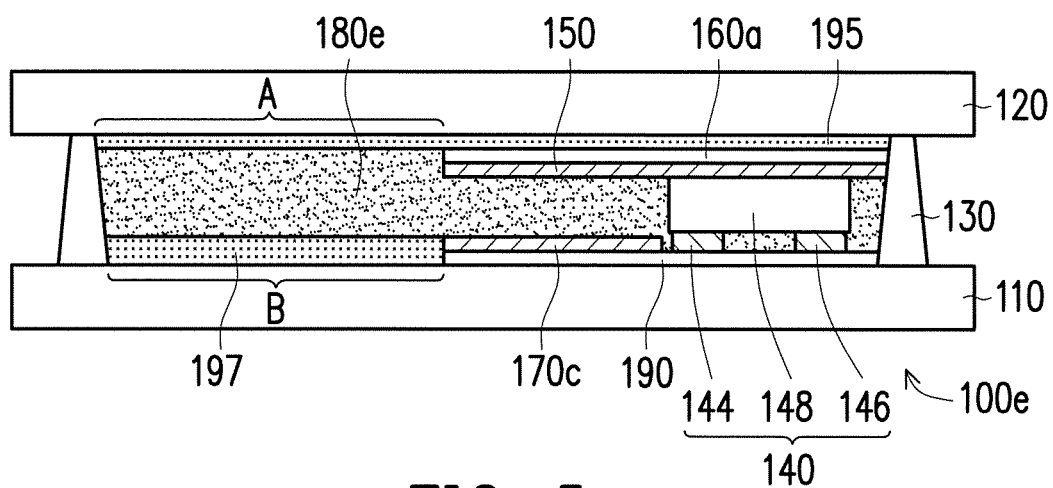
FIG. 5 is a partial cross-sectional view of an LED display device according to another embodiment of the disclosure.

FIG. 5 is a partial cross-sectional view of an LED display device according to another embodiment of the disclosure. Referring to FIG. 5, the LED display device 100e of the present embodiment is similar to the LED display device 100c of FIG. 3, and a main difference there between is that the light diffusion material layer 180e of the LED display device 100e of the present embodiment is embodied by a quantum dot material layer, a phosphor material layer, or a combination thereof. Moreover, the LED display device 100e further includes at least one second color filter pattern 197, which is disposed on the array substrate 110, and located between the light diffusion material layer 180e and the array substrate 110. The light emitted by the LED 140 is reflected by the upper reflection layer 150 and the lower reflection layer 170c and is incident to the light diffusion material layer 180e in the lateral light-emitting manner, and the light diffusion material layer 180e increases a length of the optical path of the light emitted by the LED 140, and improves a light conversion effect. Then, the light after light mixing is further filtered by the first color filter pattern 195 and the second color filter pattern 197, and the light emitted from the first light-emitting region A and the second light-emitting region B has better light uniformity or color purity.

Figure 6:
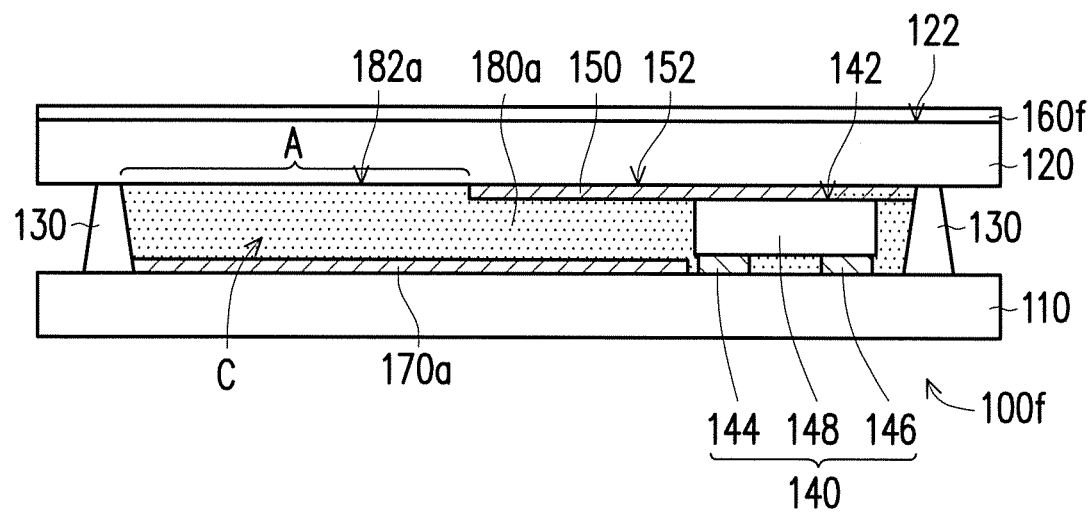
FIG. 6 is a partial cross-sectional view of an LED display device according to another embodiment of the disclosure.

FIG. 6 is a partial cross-sectional view of an LED display device according to another embodiment of the disclosure. Referring to FIG. 6, the LED display device 100f of the present embodiment is similar to the LED display device 100a of FIG. 1A, and a main difference between the LED display device 100f and the LED display device 100a is that the first light barrier layer 160f of the LED display device 100f of the present embodiment is a polarizer, which is located on the surface 122 of the opposite substrate 120 away from the array substrate 110, wherein the polarizer can be a reflective polarizer or a light-absorbing polarizer, and is used for blocking an external light coming from the top of the opposite substrate 120. In the embodiment, the first light barrier layer 160f can also be a long pass filter to filter out short wavelength light, or let long wavelength light pass through. In this case, the surface 152 of the upper reflection layer 150 is aligned with the second surface 182a of the light diffusion material layer 180a.

Figure 7:
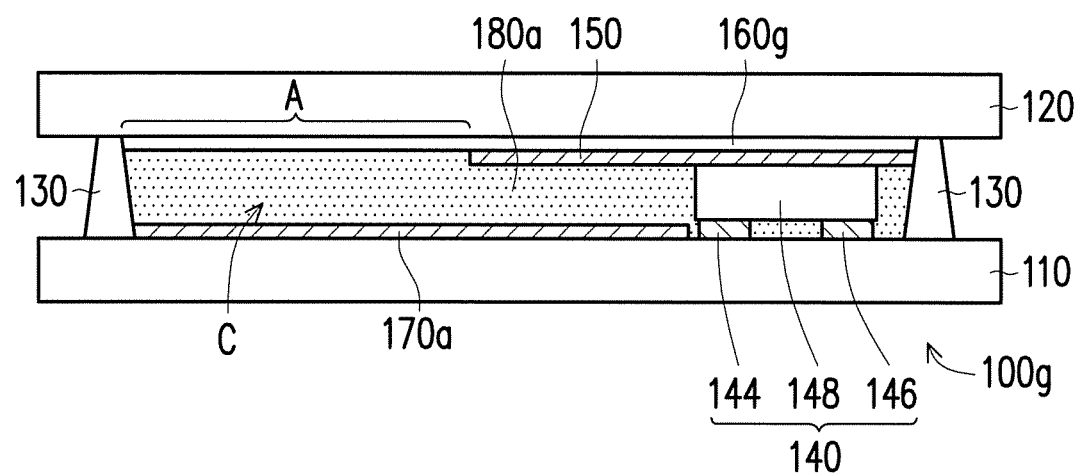
FIG. 7 is a partial cross-sectional view of an LED display device according to another embodiment of the disclosure.

FIG. 7 is a partial cross-sectional view of an LED display device according to another embodiment of the disclosure. Referring to FIG. 7, the LED display device 100g of the present embodiment is similar to the LED display device 100a of FIG. 1A, and a main difference between the LED display device 100g and the LED display device 100a is that the first light barrier layer 160g of the LED display device 100g of the present embodiment is an ultraviolet (UV) absorbing layer, which is located between the light diffusion material layer 180a and the opposite substrate 120, and the first light barrier layer 160g is also located between the upper reflection layer 150 and the opposite substrate 120. The UV absorbing layer at least completely covers the first light-emitting region A, and absorbs UV light coining from the top of the opposite substrate 120, and prevent the UV light from exciting the light diffusion material layer 180a.

Figure 8A:
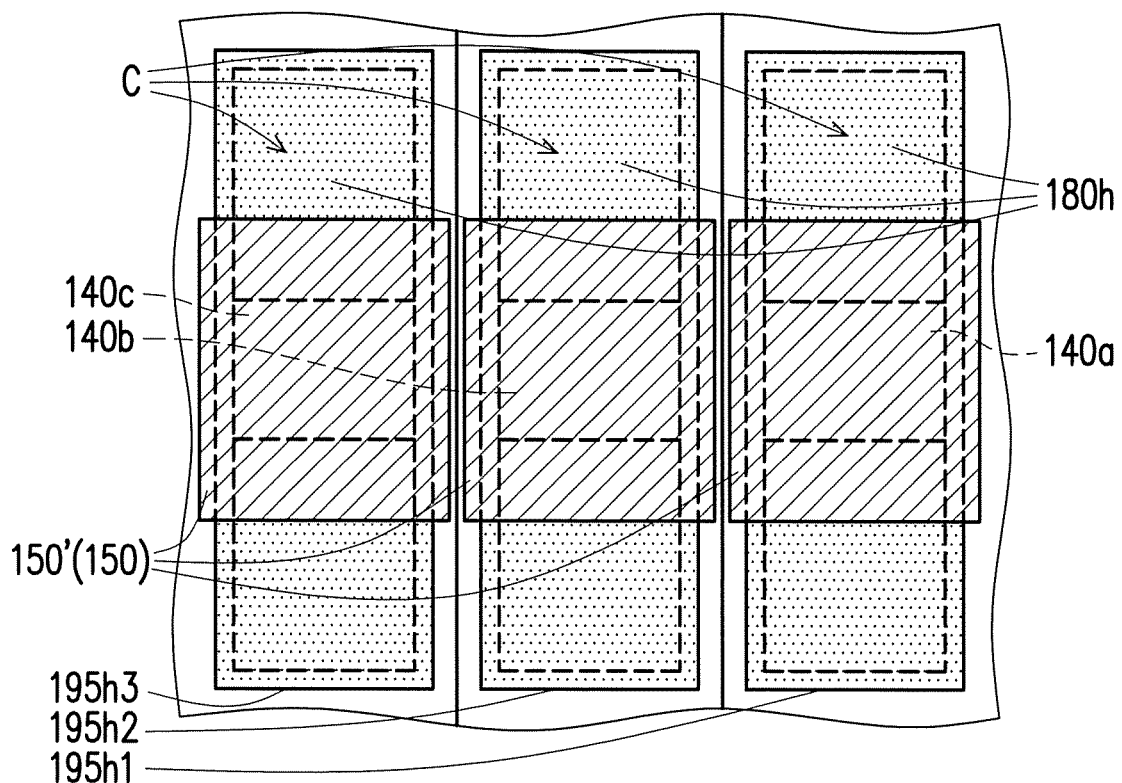
FIG. 8A to FIG. 8E are partial top views of LED display devices according to a plurality of embodiments of the disclosure.

FIG. 8A to FIG. 8E are partial top views of LED display devices according to a plurality of embodiments of the disclosure. Referring to FIG. 8A, the LED display device 100h of the present embodiment includes a plurality of LEDs, and the plurality of LEDs may emit a same color light or at least two different color lights. For example, the plurality of LEDs of the present embodiment may emit different color lights, for example, a blue light LED 140a, a green light LED 140b and a red light LED 140c, and the blue light LED 140a, the green light LED 140b and the red light LED 140c are respectively located in different accommodating regions C. The light diffusion material layer 180h is embodied as a scattering material layer, wherein the light diffusion material layer 180h is filled in the accommodating regions C. Moreover, the LED display device 100h of the present embodiment may selectively include a plurality of color filter patterns, which have at least two different colors, for example, a blue filter pattern 195h1, a green filter pattern 195h2, a red filter pattern 195h3, which are respectively located in the accommodating regions C.

Figure 8B:
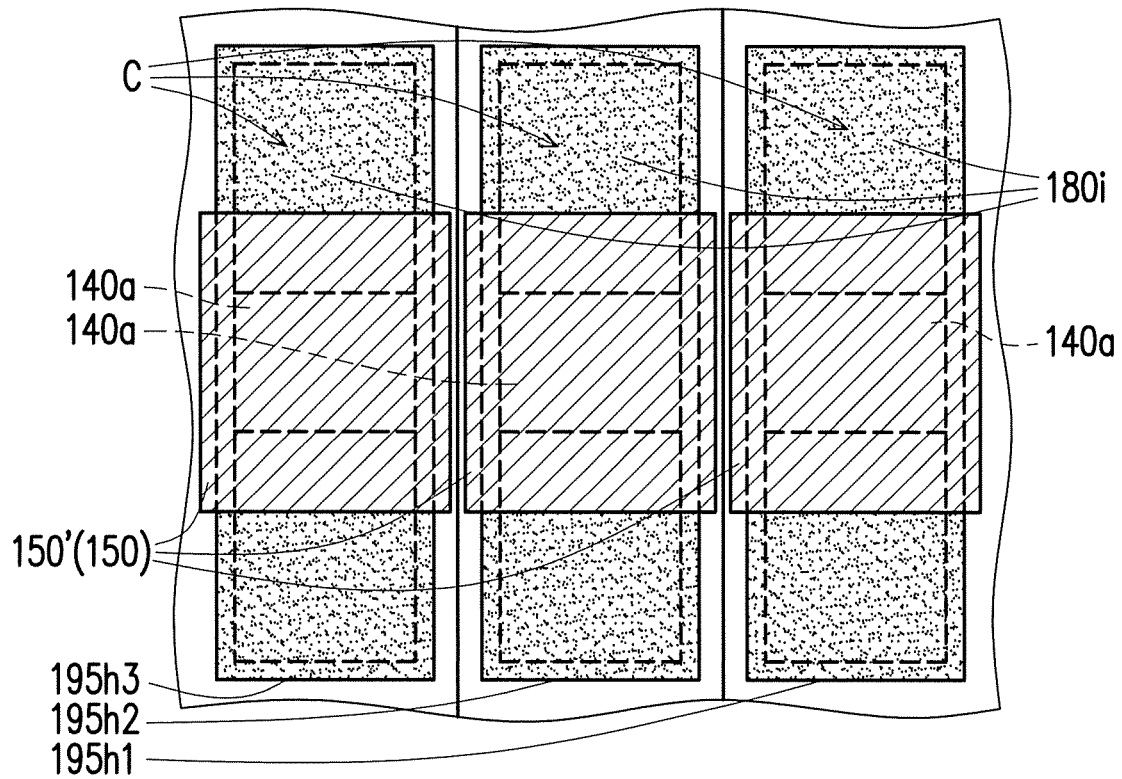

Referring to FIG. 8B, the LED display device 100i of the present embodiment is similar to the LED display device 100h of FIG. 8A, and a main difference between the LED display device 100i and the LED display device 100h is that the plurality of LEDs of the present embodiment are all blue light LEDs 140a, and the light diffusion material layer 180i is embodied as a quantum dot material layer doped with red quantum dots and green quantum dots, or a quantum dot material layer doped with yellow quantum dots.

Figure 8C:
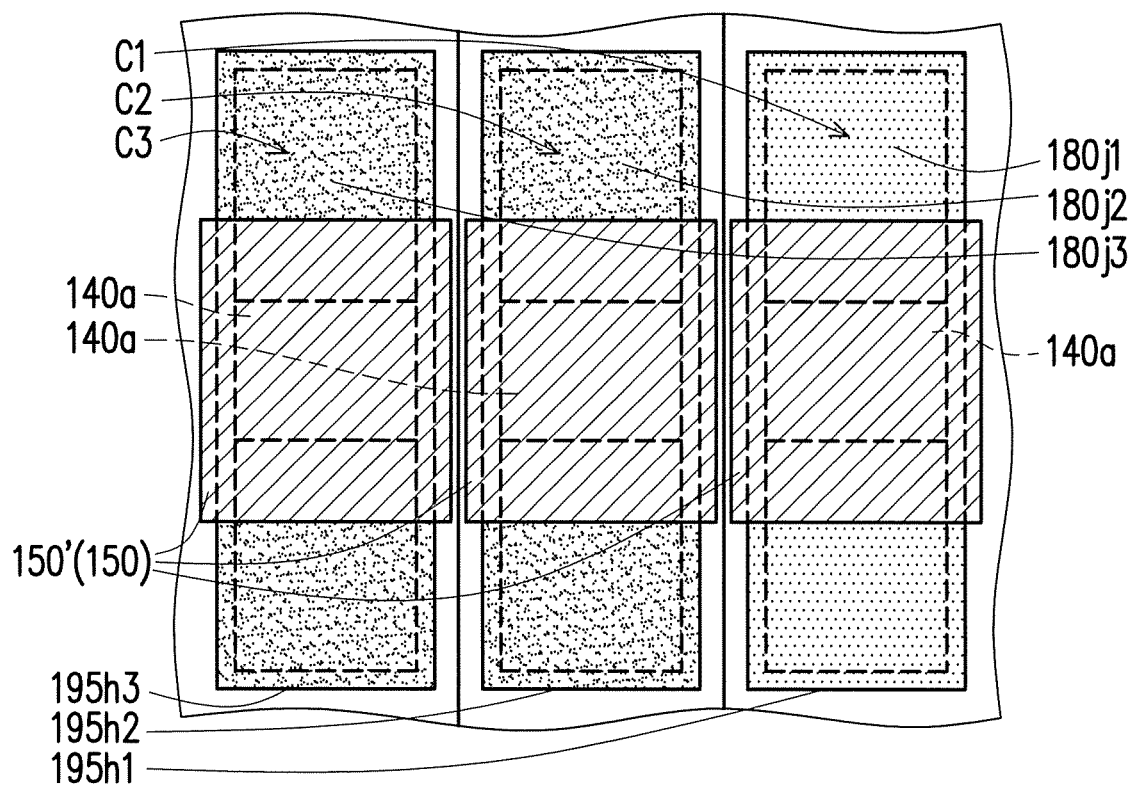

Referring to FIG. 8C, the LED display device 100j of the present embodiment is similar to the LED display device 100*i* of FIG. 8B, and a main difference there between is that the light diffusion material layer of the present embodiment includes a scattering material layer 180*j*1, a green quantum dot layer 180*j*2 and a red quantum dot layer 180*j*3, which are respectively disposed in the accommodating regions C1, C2, C3.

Figure 8D:
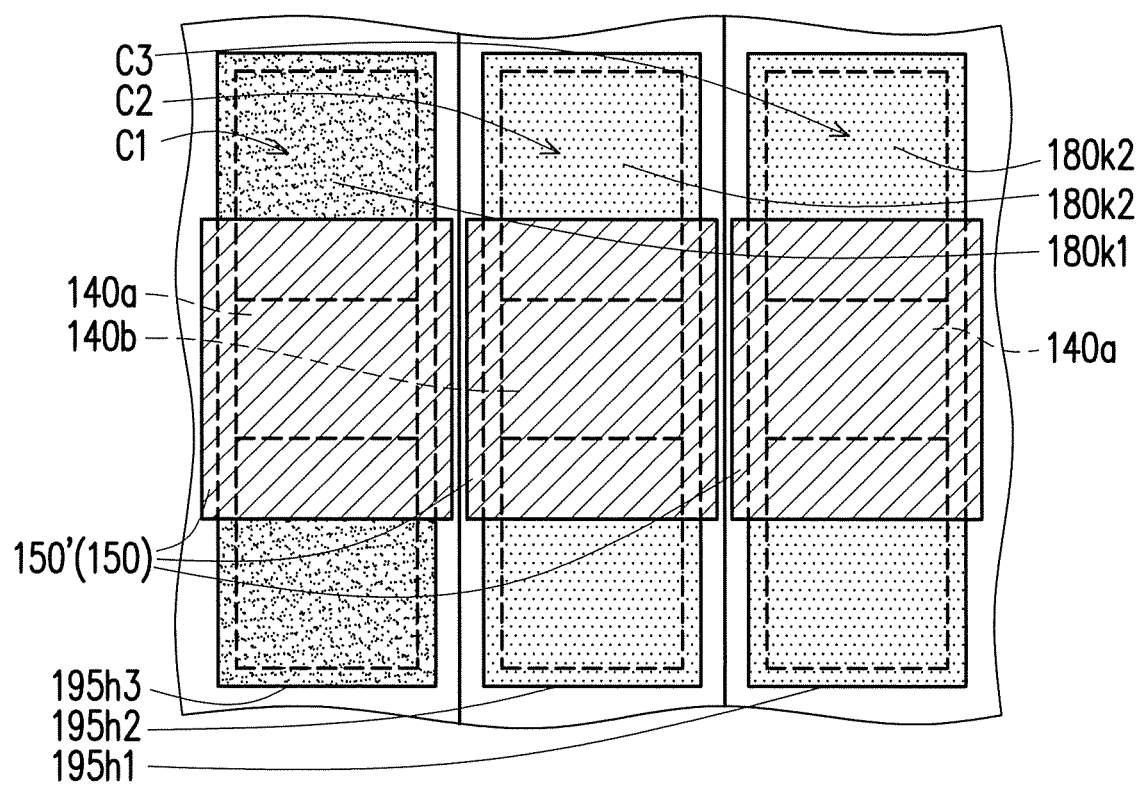

Referring to FIG. 8D, the LED display device 100*k* of the present embodiment is similar to the LED display device 100*h* of FIG. 8A, and a main difference between the LED display device 100*k* and the LED display device 100*h* is that the plurality of LEDs are two blue light LEDs 140*a* and a green light LED 140*b*, and the light diffusion material layer includes a red quantum dot layer 180*k*1 and a scattering material layer 180*k*2. The blue light LEDs 140*a* are located in the accommodating region C1 and the accommodating region C3, and the green light LED 140*b* is located in the accommodating region C2. The red quantum dot layer 180*k*1 is filled in the accommodating region C1, and the scattering material layer 180*k*2 is filled in the accommodating region C2 and the accommodating region C3.

Figure 8E:
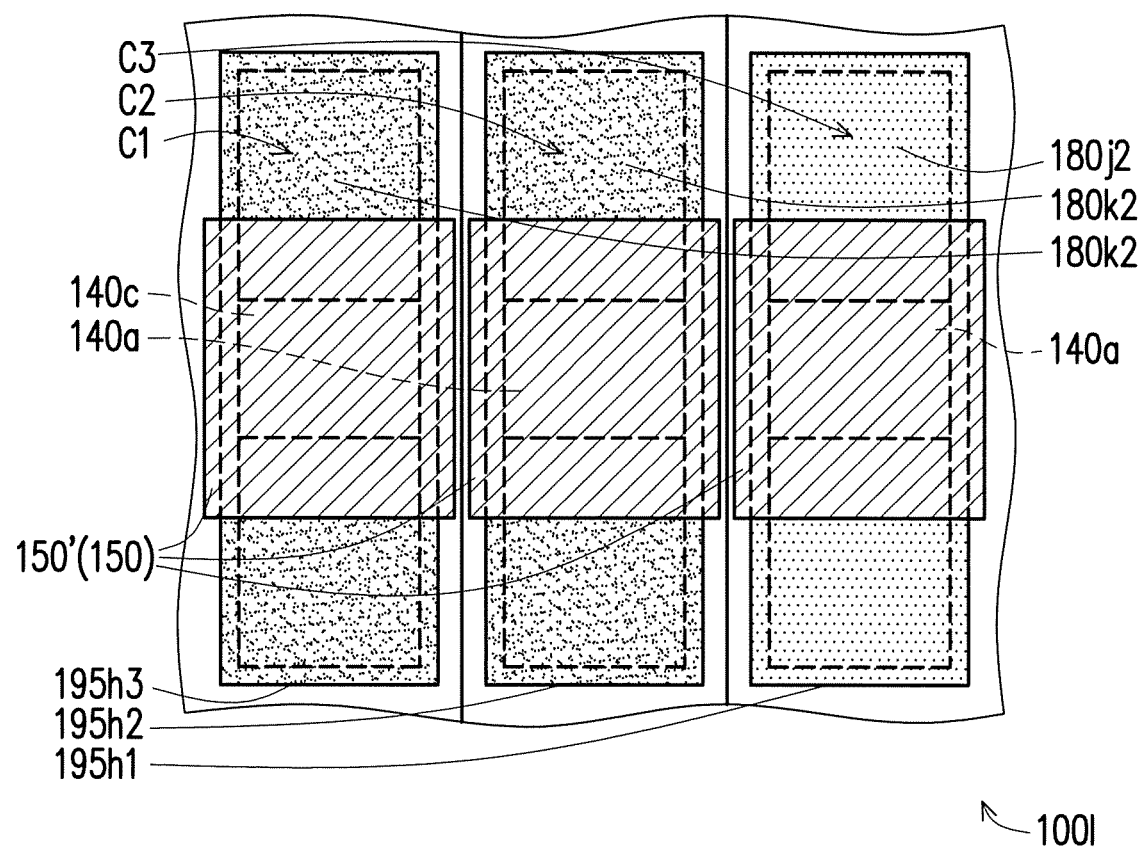

Referring to FIG. 8E, the LED display device 100*l* of the present embodiment is similar to the LED display device 100*h* of FIG. 8A, and a main difference between the LED display device 100*l* and the LED display device 100*h* is that the plurality of LEDs include two blue light LEDs 140*a* and a red light LED 140*c*, and the light diffusion material layer includes a green quantum dot layer 180*j*2 and a scattering material layer 180*k*2. The red light LED 140*c* is located in the accommodating region C1 and corresponds to the scattering material layer 180*k*2. The two blue light LEDs 140*a* are respectively located in the accommodating regions C2 and C3. One of the blue light LEDs 140*a* located in one of the accommodating regions C2 and C3 (for example, the blue light LED 140*a* located in the accommodating region C2) corresponds to the scattering material layer 180*k*2. The other one of the blue light LEDs 140*a* located in the other one of the accommodating regions C2 and C3 (for example, the blue light LED 140*a* located in the accommodating region C3) corresponds to the green quantum dot layer 180*j*2.

Figure 9:
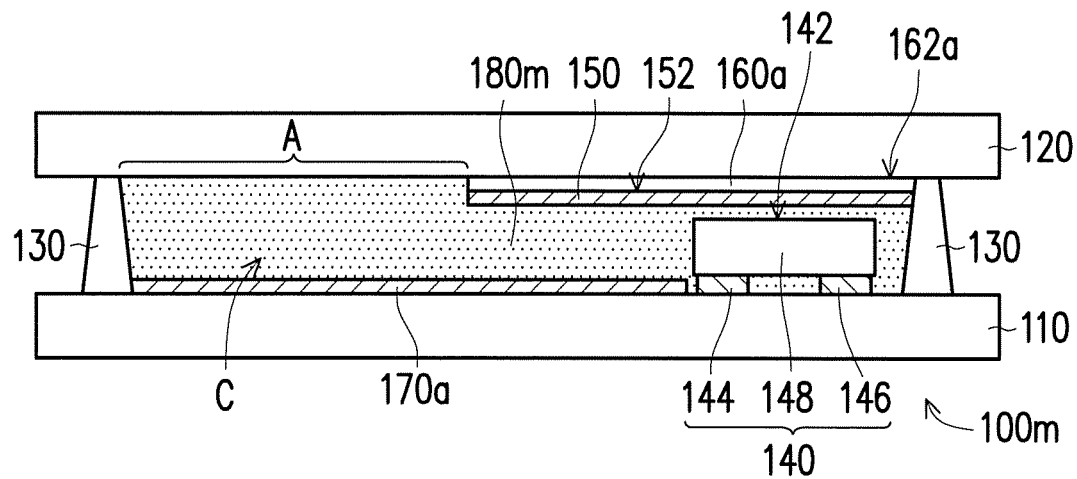
FIG. 9 is a partial cross-sectional view of an LED display device according to another embodiment of the disclosure.

FIG. 9 is a partial cross-sectional view of an LED display device according to another embodiment of the disclosure. Referring to FIG. 9, an LED display device 100*m* of the present embodiment is similar to the LED display device 100*a* of FIG. 1A, and the main difference between the two is: a portion of the light diffusion material layer 180*m* of the present embodiment is located between the upper surface 142 of the LED 140 and the upper reflection layer 150. In other words, the light diffusion material layer 180*m* directly covers the upper surface 142 of the LED 140.

Figure 10:
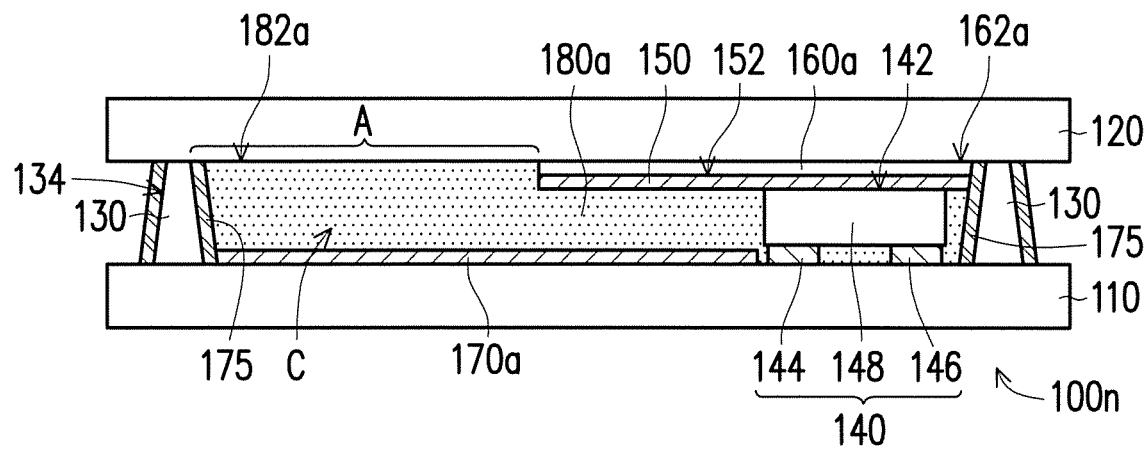
FIG. 10 is a partial cross-sectional view of an LED display device according to another embodiment of the disclosure.

FIG. 10 is a partial cross-sectional view of an LED display device according to another embodiment of the disclosure. Referring to FIG. 10, an LED display device 100*n* of the present embodiment is similar to the LED display device 100*a* of FIG. 1A, and the main difference between the two is: the LED display device 100*n* of the present embodiment includes a plurality of side reflection layers 175 respectively disposed on the wall structures 130. In an embodiment, the plurality of side reflection layers 175 can optionally be disposed at a side of at least one of the wall structures 130, or cover a surrounding surface 134 of each of the wall structures 130, or the side reflection layers 175 can even be extended on the array substrate 100, and the disclosure is not limited in this regard. The plurality of side reflection layers 175 can optionally be in contact with at least one of the upper reflection layer 150 or the lower reflection layer 170*a*, or the plurality of side reflection layers 175 can be in direct contact with the light diffusion material layer 180*a*, and more light emitted by the LED 140 can be reflected.

Moreover, in other embodiments not shown, the reflective structure mentioned above can also be used, and those skilled in the art can use the components above with reference to the embodiments above based on actual need to achieve the desired technical effect.

Figure 11:
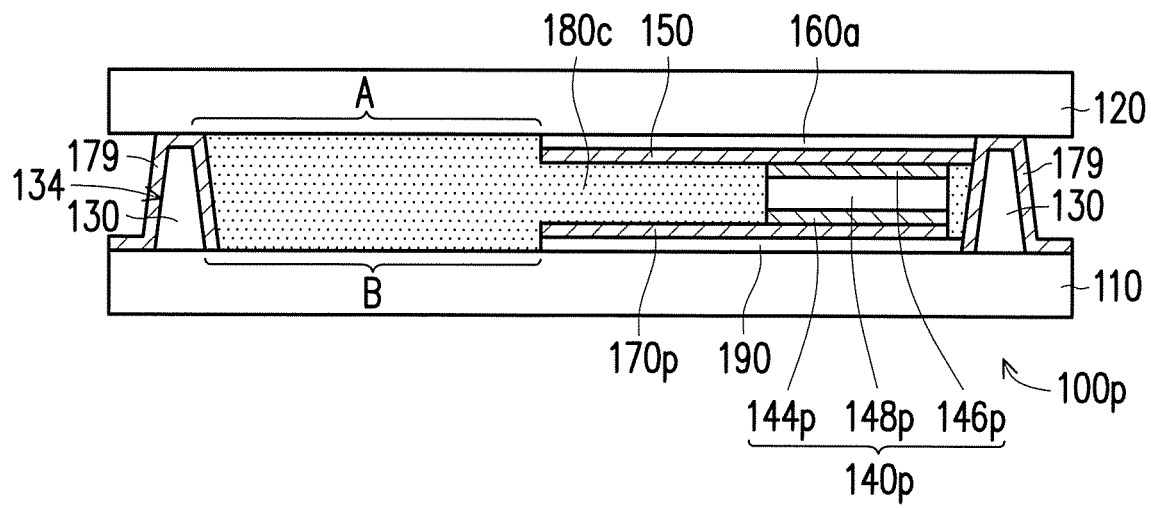
FIG. 11 is a partial cross-sectional view of an LED display device according to another embodiment of the disclosure.

FIG. 11 is a partial cross-sectional view of an LED display device according to another embodiment of the disclosure. Referring to FIG. 11, an LED display device 100*p* of the present embodiment is similar to the LED display device 100*c* of FIG. 3, and the main difference between the two is: an LED 140*p* of the present embodiment includes a first electrode 144*p*, a second electrode 146*p*, and an epitaxial structure layer 148*p*, wherein the first electrode 144*p* and the second electrode 146*p* are respectively located on different sides of the epitaxial structure layer 148*p*, the first electrode 144*p* and the second electrode 146*p* are respectively in direct contact with the upper reflection layer 150 and the lower reflection layer 170*p*. In other words, the first electrode 144*p* of the present embodiment is located on the lower reflection layer 170*p*, and the first electrode 144*p* is in direct contact with the lower reflection layer 170*p*, and the second electrode 146*p* is in direct contact with the upper reflection layer 150. In short, the LED 140*p* of the present embodiment is specifically a perpendicular LED. Moreover, the LED display device 100*p* of the present embodiment includes a plurality of side reflection layers 179, and the side reflection layers 179 can also include a conductive material such as ITO, metal, or a combination thereof, and the disclosure is not limited in this regard. The plurality of side reflection layers 179 can optionally be disposed on a sidewall of at least one of the wall structures 130, or cover the surrounding surface 134 of each of the wall structures 130, or can even be extended on the array substrate 100, and the disclosure is not limited in this regard. At least one of the reflection layers can optionally be electrical connected with the upper reflection layer 150 and the array substrate 110. The side reflection layers are electrically connected to the upper reflection layer 150 and the array substrate 110, wherein voltage can be supplied by the array substrate 110.

Figure 12:
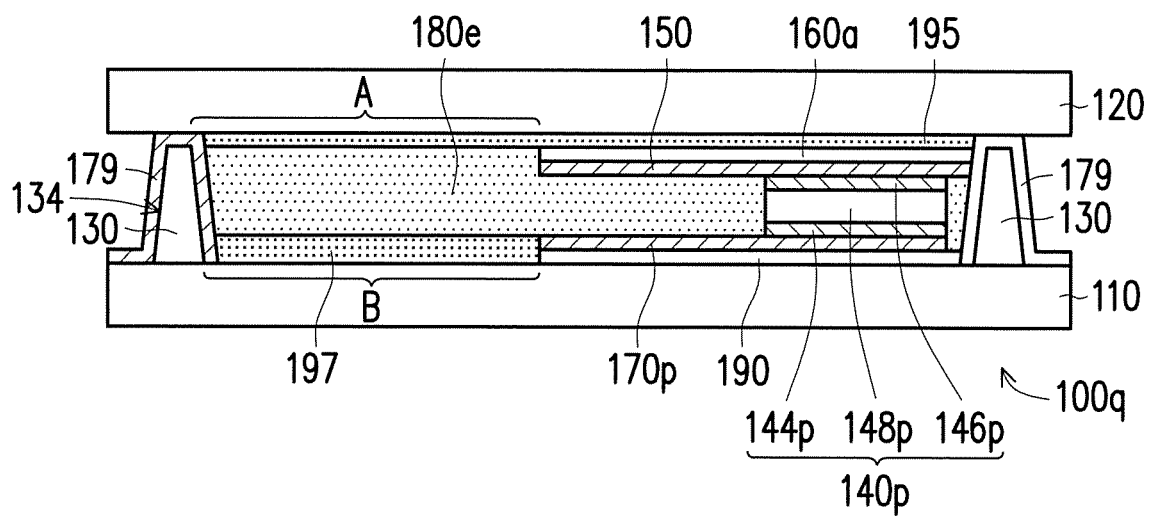
FIG. 12 is a partial cross-sectional view of an LED display device according to another embodiment of the disclosure.

FIG. 12 is a partial cross-sectional view of an LED display device according to another embodiment of the disclosure. An LED display device 100*q* of the present embodiment is similar to the LED display device 100*p* of FIG. 11, and the main difference between the two is: a light diffusion material layer 180*e* of the LED display device 100*q* is specifically a quantum dot material layer, a phosphor material layer, or a combination thereof, and the disclosure is not limited in this regard. Moreover, the LED display device 100*q* of the present embodiment further includes at least one second color filter pattern 197 disposed on the array substrate 110 and located between the light diffusion material layer 180*e* and the array substrate 110. Light emitted by the LED 140*p* is incident on the light diffusion material layer 180*e* in a lateral manner via the reflection of the upper reflection layer 150 and the lower reflection layer 170*p*, and the optical path length of the light emitted by the LED 140*p* is increased by the light diffusion material layer 180*e*, such that the effect of light conversion can be effectively increased. Next, the mixed light can be filtered by the first color filter pattern 195 and the second color filter pattern 197, and light from the first light-emitting region A and the second light-emitting region B has better uniformity.

In summary, since the light diffusion material layer of the LED display device of the disclosure is filled in the accommodating region defined by the wall structures, the array substrate and the opposite substrate, the orthographic projection of the upper reflection layer on the array substrate is at least partially overlapped with the orthographic projection of the LED on the array substrate, the LED can emit lights from a lateral direction. Compared to the conventional LED display device in which the wavelength conversion material layer is disposed on the light-emitting surface of the LED, and the LED emits light from a forward direction, the LED display device of the disclosure is unnecessary to preserve the thickness of the wavelength conversion material layer, and the thickness of the whole structure is thinner.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A light-emitting diode display device, comprising:
    an array substrate, wherein the array substrate is a thin-film transistor substrate;
    an opposite substrate, disposed opposite to the array substrate;
    a plurality of wall structures, disposed between the array substrate and the opposite substrate, wherein orthographic projections of each of the wall structures at least partially overlap the opposite substrate, and the array substrate, the wall structures and the opposite substrate define at least one accommodating region;
    at least one light-emitting diode, disposed on the array substrate, and located in the at least one accommodating region;
    an upper reflection layer, disposed between the at least one light-emitting diode and the opposite substrate, wherein an orthographic projection of the upper reflection layer on the array substrate at least partially overlapped with an orthographic projection of the at least one light-emitting diode on the array substrate;
    a first light barrier layer, disposed between the upper reflection layer and the opposite substrate;
    a lower reflection layer, disposed on the array substrate, and located in the at least one accommodating region, wherein the orthographic projection of the upper reflection layer on the array substrate is at least partially overlapped with an orthographic projection of the lower reflection layer on the array substrate; and
    a light diffusion material layer, filled in the at least one accommodating region.

2. The light-emitting diode display device as claimed in claim 1, wherein the light diffusion material layer comprises a quantum dot material layer or a phosphor material layer.

3. The light-emitting diode display device as claimed in claim 1, wherein the first light barrier layer is a light absorbing layer, wherein at least a part of the light diffusion material layer is overlapped with the light absorbing layer.

4. The light-emitting diode display device as claimed in claim 1, wherein the at least a part of the light diffusion material layer is not overlapped with the upper reflection layer to define a first light-emitting region.

5. The light-emitting diode display device as claimed in claim 4, further comprising:
    a second light barrier layer, at least a part of the second light barrier layer being disposed between the array substrate and the lower reflection layer, wherein the orthographic projection of the lower reflection layer on the array substrate is at least partially overlapped with the orthographic projection of the upper reflection layer on the array substrate, and a part of the light diffusion material layer is not covered by the second reflection layer and the second light barrier layer to define a second light-emitting region.

6. The light-emitting diode display device as claimed in claim 1, further comprising:
    at least one first color filter pattern, disposed on the opposite substrate, and located between the opposite substrate and the light diffusion material layer.

7. The light-emitting diode display device as claimed in claim 6, further comprising:
    at least one second color filter pattern, disposed on the array substrate, and located between the light diffusion material layer and the array substrate.

8. The light-emitting diode display device as claimed in claim 1, wherein the at least one light-emitting diode comprises a plurality of light-emitting diodes, main light-emitting wavelengths of the plurality of the light-emitting diodes are within a wavelength range of a specific color light, the at least one accommodating region comprises a plurality of accommodating regions, each of the accommodating regions is configured with at least two light-emitting diodes, and an absolute value of a difference between two color point coordinates in the accommodating region within the wavelength range of the specific color light is smaller than 0.03.

9. The light-emitting diode display device as claimed in claim 1, wherein the at least one light-emitting diode is located close to a side of the at least one accommodating region or located at a center of the at least one accommodating region.

10. The light-emitting diode display device as claimed in claim 1, wherein the at least one light-emitting diode comprises a plurality of light-emitting diodes, the at least one accommodating region comprises a plurality of accommodating regions, and the plurality of the light-emitting diodes in two adjacent accommodating regions of the plurality of accommodating regions are located at alternate ends of one end and another end of the two adjacent accommodating regions.

11. The light-emitting diode display device as claimed in claim 1, wherein the at least one light-emitting diode comprises a plurality of light-emitting diodes, the plurality of the light-emitting diodes emit a same color light or at least two different color lights, the at least one accommodating region comprises a plurality of accommodating regions, and the light-emitting diodes are respectively located in the plurality of the accommodating regions.

12. The light-emitting diode display device as claimed in claim 11, wherein the plurality of the light-emitting diodes are blue light light-emitting diodes, and the light diffusion material layer comprises a red quantum dot layer, a green quantum dot layer, and a scattering material layer, wherein the blue light light-emitting diodes are respectively located in the accommodating regions, and the red quantum dot layer, the green quantum dot layer and the scattering material layer are respectively filled in the accommodating regions and correspond to the blue light light-emitting diodes.

13. The light-emitting diode display device as claimed in claim 11, wherein the plurality of the light-emitting diodes comprise a first blue light light-emitting diode, a second blue light light-emitting diode and a first green light light-emitting diode, the plurality of the accommodating regions comprise a first accommodating region, a second accommodating region and a third accommodating region, the light diffusion material layer comprises a red quantum dot layer and a scattering material layer, wherein the first blue light light-emitting diode and the second blue light light-emitting diode are respectively located in the first accommodating region and the third accommodating region, the first green light light-emitting diode is located in the second accommodating region, the red quantum dot layer is filled in the first accommodating region, and the scattering material layer is filled in the second accommodating region and the third accommodating region.

14. The light-emitting diode display device as claimed in claim 11, wherein the plurality of the accommodating regions comprise a first accommodating region, a second accommodating region and a third accommodating region, and the plurality of the light-emitting diodes comprise a red light light-emitting diode, a green light light-emitting diode and a blue light light-emitting diode respectively disposed in the first accommodating region, the second accommodating region and the third accommodating region, and the light diffusion layer is a scattering material layer.

15. The light-emitting diode display device as claimed in claim 1, wherein a thickness of the light diffusion material layer is 0.5 µm to 30 µm.

16. The light-emitting diode display device as claimed in claim 1, wherein the at least one light-emitting diode comprises a first electrode, a second electrode, and an epitaxial structure layer, and the first electrode and the second electrode are located on a same side of the epitaxial structure layer.

17. The light-emitting diode display device as claimed in claim 1, further comprising:

a plurality of side reflection layers respectively disposed on the plurality of wall structures, wherein the plurality of side reflection layers is at least in direct contact with one of the upper reflection layer and the lower reflection layer.

18. The light-emitting diode display device as claimed in claim 1, wherein a portion of the light diffusion material layer is located between the upper surface of the at least one light-emitting diode and the upper reflection layer.

19. The light-emitting diode display device as claimed in claim 1, further comprising:

a plurality of side reflection layers covering a surrounding surface of each of the plurality of wall structures, and at least one of the plurality of side reflection layers electrically connected with the upper reflection layer and the array substrate.

20. The light-emitting diode display device as claimed in claim 19, wherein the at least one light-emitting diode comprises a first electrode, a second electrode, and an epitaxial structure layer, and the first electrode and the second electrode are respectively located on different sides of the epitaxial structure layer and respectively in contact with the upper reflection layer and the lower reflection layer.

* * * * *